(12) United States Patent
Chen et al.

(10) Patent No.: US 7,772,121 B2
(45) Date of Patent: Aug. 10, 2010

(54) METHOD OF FORMING A TRENCH STRUCTURE

(75) Inventors: Liang-Yuh Chen, Foster City, CA (US); Daniel A. Carl, Pleasanton, CA (US); Israel Beinglass, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 11/424,351

(22) Filed: Jun. 15, 2006

(65) Prior Publication Data

US 2006/0223322 A1   Oct. 5, 2006

Related U.S. Application Data

(62) Division of application No. 09/974,535, filed on Oct. 9, 2001, now Pat. No. 7,115,516.

(51) Int. Cl.
*H01L 21/00* (2006.01)

(52) U.S. Cl. ............... 438/695; 438/696; 438/692

(58) Field of Classification Search ............ 438/692, 438/695–696
See application file for complete search history.

(56) References Cited

U.S. PATENT DOCUMENTS

| | | | |
|---|---|---|---|
| 4,599,135 A * | 7/1986 | Tsunekawa et al. | 216/37 |
| 4,874,493 A | 10/1989 | Pan | |
| 5,089,442 A | 2/1992 | Olmer | |
| 5,108,543 A | 4/1992 | Suzuki et al. | |
| 5,445,699 A | 8/1995 | Kamikawa et al. | |
| 5,614,055 A * | 3/1997 | Fairbairn et al. | 156/345.33 |
| 5,688,382 A * | 11/1997 | Besen et al. | 204/192.12 |
| 5,720,821 A | 2/1998 | Halpern | |
| 5,851,600 A * | 12/1998 | Horiike et al. | 427/535 |
| 5,893,758 A | 4/1999 | Sandhu et al. | |
| 5,972,235 A * | 10/1999 | Brigham et al. | 216/49 |
| 5,976,970 A * | 11/1999 | Dalal et al. | 438/637 |
| 5,983,906 A | 11/1999 | Zhao et al. | |
| 6,030,881 A | 2/2000 | Papasouliotis et al. | |
| 6,051,503 A * | 4/2000 | Bhardwaj et al. | 438/705 |

(Continued)

FOREIGN PATENT DOCUMENTS

EP   0591082   4/1994

(Continued)

OTHER PUBLICATIONS

PCT Search Report, International Patent Application No. PCT/US02/30276, mail date Dec. 19, 2002.

(Continued)

*Primary Examiner*—Laura M Menz
(74) *Attorney, Agent, or Firm*—Patterson & Sheridan, LLP

(57) ABSTRACT

A method of layer formation on a substrate with high aspect ratio features is disclosed. The layer is formed from a gas mixture comprising one or more process gases and one or more etch species. The one or more process gases react to deposit a material layer on the substrate. In conjunction with the material layer deposition, the etch species selectively remove portions of the deposited material layer adjacent to high aspect ratio feature openings, filling such features in a void-free and/or seam-free manner. The material layer may be deposited on the substrate using physical vapor deposition (PVD) and/or chemical vapor deposition (CVD) techniques.

6 Claims, 8 Drawing Sheets

U.S. PATENT DOCUMENTS

| | | | |
|---|---|---|---|
| 6,077,786 A | 6/2000 | Chakravarti et al. | |
| 6,100,200 A | 8/2000 | Van Buskirk et al. | |
| 6,117,781 A | 9/2000 | Lukanc et al. | |
| 6,136,685 A | 10/2000 | Narwankar et al. | |
| 6,144,894 A | 11/2000 | Nguyen | |
| 6,176,983 B1 | 1/2001 | Bothra et al. | |
| 6,187,685 B1 * | 2/2001 | Hopkins et al. | 438/710 |
| 6,211,040 B1 | 4/2001 | Liu et al. | |
| 6,261,962 B1 * | 7/2001 | Bhardwaj et al. | 438/702 |
| 6,348,420 B1 * | 2/2002 | Raaijmakers et al. | 438/769 |
| 6,417,013 B1 * | 7/2002 | Teixeira et al. | 438/5 |
| 6,432,830 B1 * | 8/2002 | Merry | 438/706 |
| 6,544,900 B2 * | 4/2003 | Raaijmakers et al. | 438/769 |
| 6,582,617 B1 * | 6/2003 | Pong | 216/49 |
| 7,115,516 B2 * | 10/2006 | Chen et al. | 438/695 |
| 7,244,474 B2 * | 7/2007 | Hanawa et al. | 427/562 |
| 7,291,360 B2 * | 11/2007 | Hanawa et al. | 427/248.1 |
| 7,427,568 B2 * | 9/2008 | Chen et al. | 438/695 |
| 2002/0052124 A1 * | 5/2002 | Raaijmakers et al. | 438/778 |
| 2003/0092280 A1 * | 5/2003 | Lee et al. | 438/720 |
| 2004/0077161 A1 * | 4/2004 | Chen et al. | 438/622 |
| 2005/0211170 A1 * | 9/2005 | Hanawa et al. | 118/723 R |
| 2005/0211171 A1 * | 9/2005 | Hanawa et al. | 118/723 R |
| 2005/0211546 A1 * | 9/2005 | Hanawa et al. | 204/192.12 |
| 2005/0211547 A1 * | 9/2005 | Hanawa et al. | 204/192.12 |
| 2005/0214477 A1 * | 9/2005 | Hanawa et al. | 427/569 |
| 2005/0214478 A1 * | 9/2005 | Hanawa et al. | 427/569 |
| 2006/0162661 A1 * | 7/2006 | Jung et al. | 118/723 ER |
| 2006/0223322 A1 * | 10/2006 | Chen et al. | 438/695 |
| 2006/0223323 A1 * | 10/2006 | Chen et al. | 438/695 |
| 2008/0182382 A1 * | 7/2008 | Ingle et al. | 438/435 |

FOREIGN PATENT DOCUMENTS

| | | |
|---|---|---|
| JP | 04-007825 | 1/1992 |
| JP | 10-154699 A | 6/1998 |
| JP | 10-321556 | 12/1998 |
| JP | 10-340900 A | 12/1998 |
| JP | 2000-345350 A | 12/2000 |
| WO | WO 99/47728 | 9/1999 |

OTHER PUBLICATIONS

Van Zant, Peter; "Microchip Fabrication 2000"; McGraw-Hill, Fourth Ed. pp. 401-403.

Notification of Second Office Action dated May 9, 2008 for Chinese Patent Application No. 02819959.6.

Prosecution History for U.S. Appl. No. 09/974,535, U.S. Patent Application No. 7,115,516, granted Oct. 31, 2006.

Prosecution History for U.S. Appl. No. 11/424,359, U.S. Patent Application No. 7,427,568, granted Sep. 23, 2008.

Office Action dated Sep. 9, 2009 for Korean Patent Application No. 10-2004-7005273.

Notice of Reasons for Rejection for Japanese Patent Application No. P2003-534642 dated May 26, 2009.

Final Rejection for Japanese Patent Application No. P2003-534642 dated Feb. 2, 2010.

* cited by examiner

METHOD OF FORMING A TRENCH STRUCTURE

CROSS-REFERENCE TO RELATED APPLICATIONS

This application is a divisional application of U.S. patent application Ser. No. 09/974,535, filed Oct. 9, 2001 now U.S. Pat. No. 7,115,516, which is incorporated by reference herein.

BACKGROUND OF THE DISCLOSURE

1. Field of the Invention

The invention relates to a method of depositing a material layer and, more particularly, to a method of depositing material layers for integrated circuit fabrication.

2. Description of the Background Art

Reliably producing sub-half micron and smaller features is one of the key technologies for the next generation of very large scale integration (VLSI) as well as ultra large scale integration (ULSI) integrated circuits. In particular, as the fringes of circuit technology are pressed, the shrinking dimensions of interconnect features in VLSI and ULSI technology has placed additional demands on processing capabilities. For example, multilevel interconnect features require careful processing of high aspect ratio (e.g., the ratio of the feature height to the feature width) structures, such as vias, lines and contacts. Reliable formation of these features is very important to the continued effort to increase circuit density and quality of integrated circuits.

As circuit densities increase, the widths of vias, lines, and contacts may decrease to sub-micron dimensions (e.g., less than 0.25 micrometers or less), whereas the thickness of the dielectric material layers between such structures typically remains substantially constant, increasing the aspect ratios for such features. Many traditional deposition processes have difficulty filling sub-micron structures where the aspect ratio exceeds 4:1, especially where the aspect ratio exceeds 10:1.

FIGS. 1A-B illustrate the possible consequences of material layer deposition in a high aspect ratio feature 6 on a substrate 1. The high aspect ratio feature 6 may be any opening such as a space formed between adjacent features 2, a contact, a via, or a trench defined in a layer 2. As shown in FIG. 1A, a material layer 11 that is deposited using conventional deposition techniques tends to be deposited on the top edges 6T of the feature 6 at a higher rate than at the bottom 6B or sides 6S thereof creating an overhang. This overhang or excess deposition of material is sometimes referred to as crowning. Such excess material continues to build up on the top edges 6T of the feature 6, until the opening is closed off by the deposited material 11 forming a void 14 therein. Additionally, as shown in FIG. 1B, a seam 8 may be formed when a material layer 11 deposited on both sides 6S of the opening 6 merges. The presence of either voids or seams may result in unreliable integrated circuit performance.

Therefore, a need exists for a method of depositing a material layer on a substrate to provide void-free and seam-free filling of high aspect ratio openings.

SUMMARY OF THE INVENTION

A method of layer formation on a substrate with high aspect ratio features is disclosed. The layer is formed from a gas mixture comprising one or more process gases and one or more etch species. The one or more process gases react to deposit a material layer on the substrate. In conjunction with the material layer deposition, the etch species selectively remove portions of the deposited material layer adjacent to high aspect ratio feature openings, filling such features in a void-free and/or seam-free manner. The material layer may be deposited on the substrate using physical vapor deposition (PVD) and/or chemical vapor deposition (CVD) techniques.

The material layer deposition process is compatible with integrated circuit fabrication techniques. In one integrated circuit fabrication technique, an oxide layer used as an insulating material for trench isolation may be deposited. For such an embodiment, a preferred process sequence includes providing a substrate having thereon, trench regions formed between active semiconductor regions. Thereafter, the trench regions are filled with an oxide layer formed from a gas mixture comprising one or more process gases and one or more etch species. The one or more process gases react to deposit the oxide layer in the trench regions. In conjunction with the oxide layer deposition, the etch species selectively remove portions of such oxide layer adjacent to high aspect ratio trench openings.

In another integrated circuit fabrication technique, an integrated circuit interconnect structure is fabricated. For such an embodiment, a preferred process sequence includes providing a silicon substrate having one or more dielectric layers thereon with apertures defined therein and conformably depositing one or more barrier layers on the surfaces of the apertures. The one or more barrier layers are formed from a gas mixture comprising one or more process gases and one or more etch species. The one or more process gases react to deposit the barrier material in the apertures. In conjunction with the barrier layer deposition, the etch species selectively remove portions of such barrier material adjacent to high aspect ratio aperture openings. After the one or more barrier layers are deposited, the interconnect structure is completed when at least one metal layer is conformably deposited on the one or more barrier layers. The metal layer is formed from a gas mixture comprising one or more process gases and one or more etch species. The one or more process gases react to deposit the metal layer in the apertures. In conjunction with the metal layer deposition, the etch species selectively remove portions of such metal layer adjacent to high aspect ratio aperture openings.

BRIEF DESCRIPTION OF THE DRAWINGS

The teachings of the present invention can be readily understood by considering the following detailed description in conjunction with the accompanying drawings, in which.

DETAILED DESCRIPTION

Figure 1A:
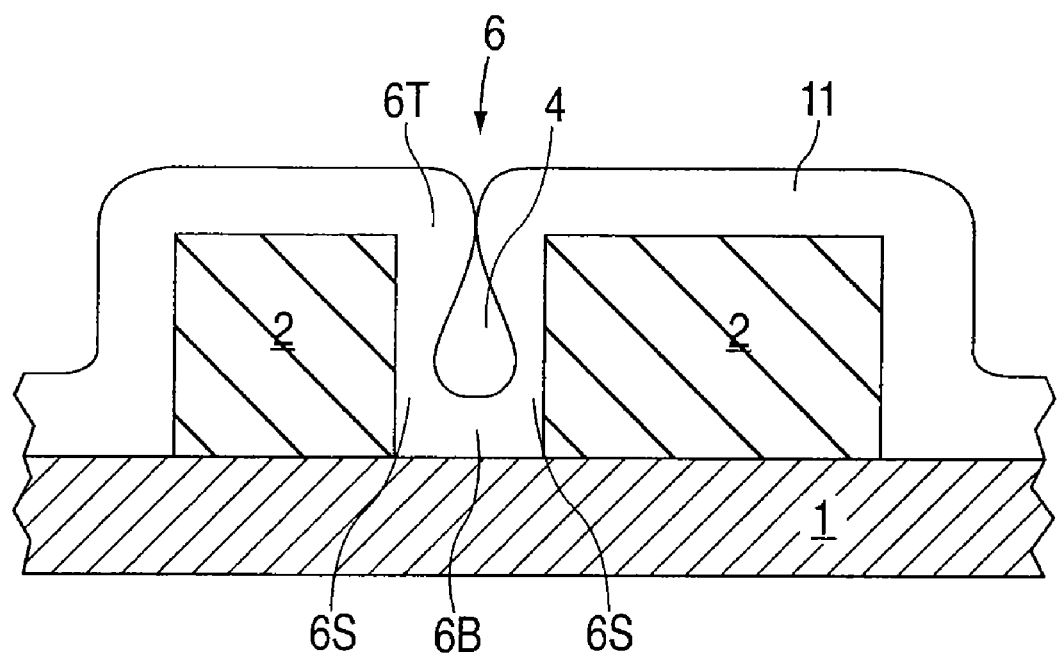
FIGS. 1A-1B are cross-sectional views of possible deposition results for high aspect ratio features filled using conventional prior art deposition processes.
Figure 1B:
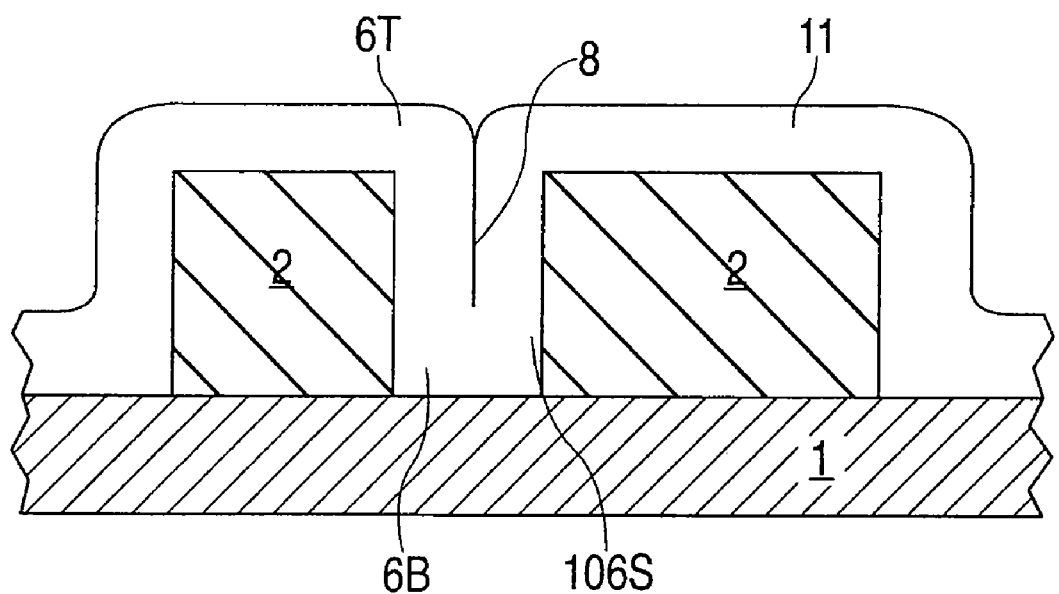
Figure 2:
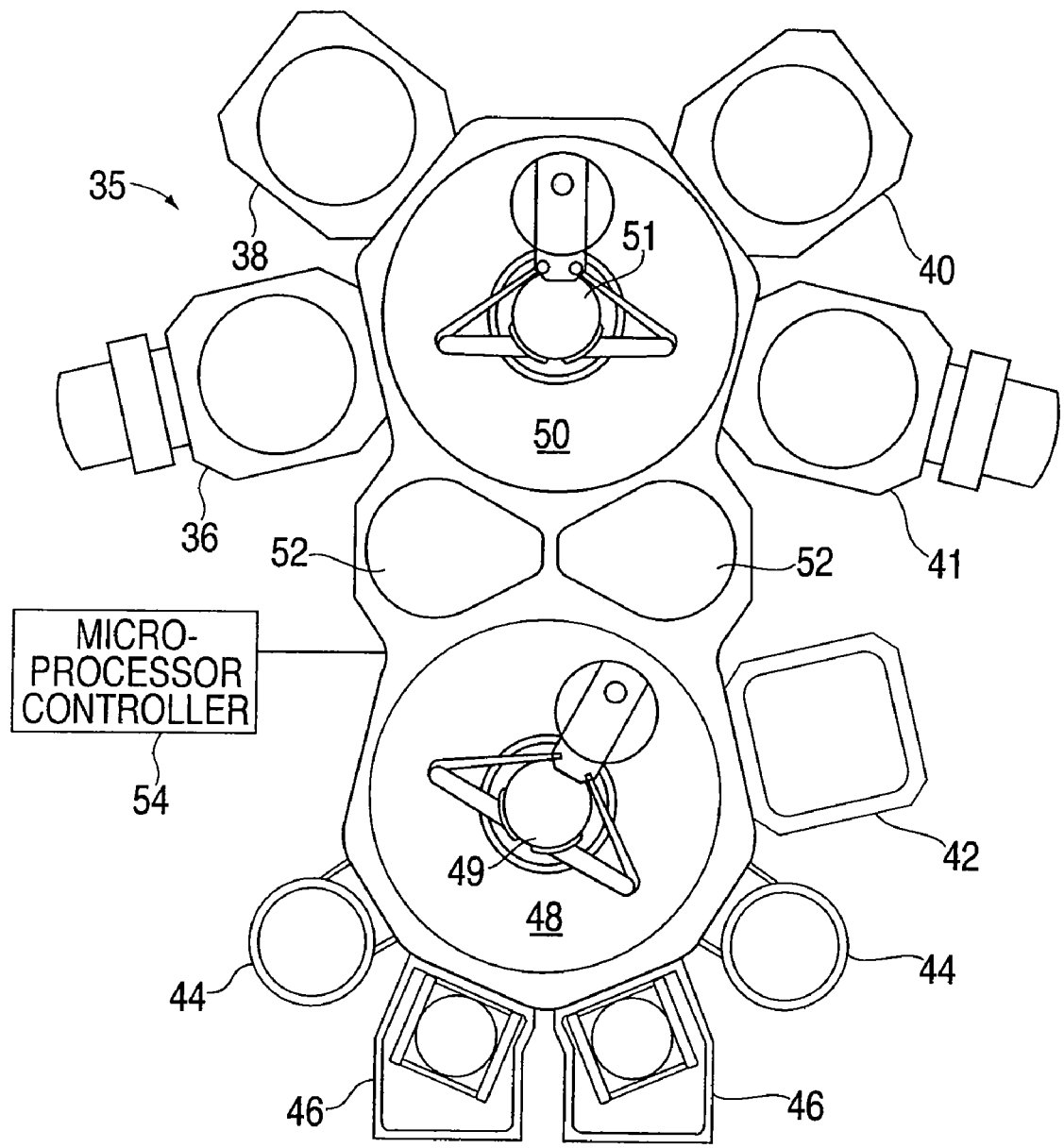
FIG. 2 depicts a schematic illustration of an apparatus that can be used for the practice of embodiments described herein.

FIG. 2 is a schematic representation of a wafer processing system 35 that can be used to perform integrated circuit metallization in accordance with embodiments described herein. The wafer processing system 35 typically comprises process chambers 36, 38, 40, 41, degas chambers 44, load-lock chambers 46, transfer chambers 48, 50, pass-through chambers 52, a microprocessor controller 54, along with other hardware components such as power supplies (not shown) and vacuum pumps (not shown). An example of such a wafer processing system 35 is an ENDURA® System, commercially available from Applied Materials, Inc., Santa Clara, Calif.

Details of the wafer processing system 35 are described in commonly assigned U.S. Pat. No. 5,186,718, entitled, "Staged-Vacuum Substrate Processing System and Method", issued on Feb. 16, 1993, and is hereby incorporated by reference. The salient features of the wafer processing system 35 are briefly described below.

The wafer processing system 35 includes two transfer chambers 48, 50, each containing a transfer robot 49, 51. The transfer chambers 48, 50 are separated one from the other by pass-through chambers 52.

Transfer chamber 48 is coupled to load-lock chambers 46, degas chambers 44, pre-clean chamber 42, and pass-through chambers 52. Substrates (not shown) are loaded into the wafer processing system 35 through load-lock chambers 46. Thereafter, the substrates are sequentially degassed and cleaned in degas chambers 44 and the pre-clean chamber 42, respectively. The transfer robot 49 moves the substrate between the degas chambers 44 and pre-clean chamber 42.

Transfer chamber 50 is coupled to a cluster of process chambers 36, 38, 40, 41. The cleaned substrates are moved from transfer chamber 48 into transfer chamber 50 via pass-through chambers 52. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include physical vapor deposition (PVD) chambers, ionized metal plasma physical vapor deposition (IMP PVD) chambers, chemical vapor deposition (CVD) chambers, rapid thermal process (RTP) chambers, and anti-reflective coating (ARC) chambers, among others.

Figure 3:
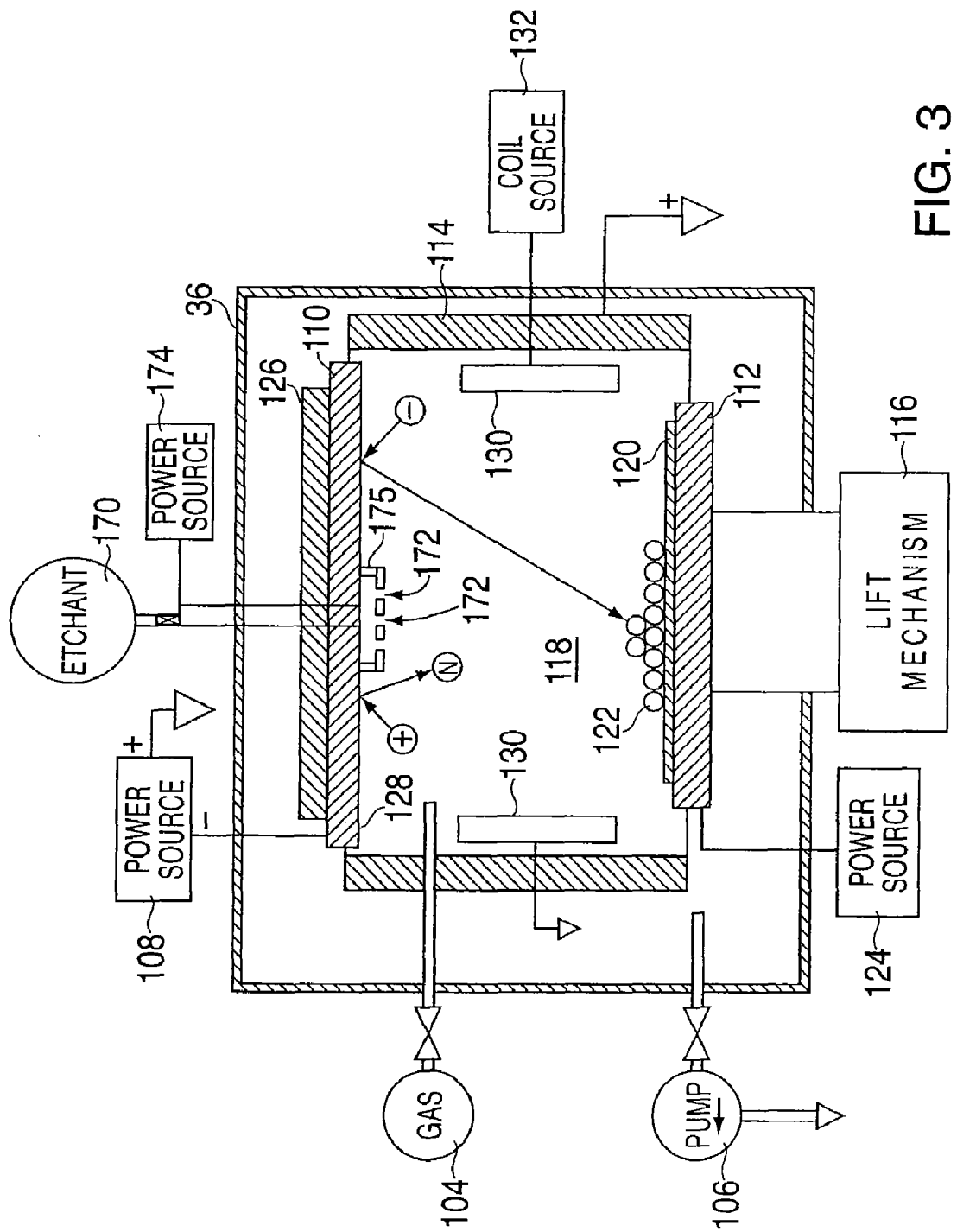
FIG. 3 depicts a schematic cross-sectional view of a physical vapor deposition (PVD) chamber.

FIG. 3 depicts a schematic cross-sectional view of a sputtering-type physical vapor deposition (PVD) process chamber 36 of wafer processing system 35. An example of such a PVD process chamber 36 is an IMP VECTRA™ chamber, commercially available from Applied Materials, Inc., Santa Clara, Calif.

The PVD chamber 36 is coupled to a gas source 104, a pump system 106, and a target power source 108. The PVD chamber 36 encloses a target 110, a substrate 120 positioned on a vertically movable pedestal 112, and a shield 114 enclosing a reaction zone 118. A lift mechanism 116 is coupled to the pedestal 112 to position the pedestal 112 relative to the target 110.

The gas source 104 supplies one or more process gases into the PVD chamber 36. The one or more process gases may comprise an inert gas such as nitrogen ($N_2$), helium (He), neon (Ne), argon (Ar), or some other inert gas. The pump system 106 controls the pressure within the PVD chamber 36.

The one or more process gases may further comprise a reactive species such as, for example, nitrogen ($N_2$) or oxygen ($O_2$). The reactive species is capable of reacting with sputtered and ionized particles from the target 110 to form a material layer 122 on the substrate 120.

The target 110 is typically suspended from the top of the PVD chamber 36. The target 110 includes a material that is sputtered during operation of the wafer processing system 35. Although the target may comprise, as a material to be deposited, an insulator or semiconductor, the target 110 generally comprises a metal. For example, the target may be formed of tantalum (Ta), tungsten (W), copper (Cu), or other materials known in the art.

The pedestal 112 supports the substrate 120 within the PVD chamber 36. The pedestal is generally disposed at a fixed distance from the target 110 during processing. However, the distance between the target 110 and the substrate 120 may be varied during processing. The pedestal 112 is supported by the lift mechanism 116, which moves the pedestal 112 along a range of vertical motion within the PVD chamber 36.

The target power source 108 is used to infuse the one or more process gases with energy and may comprise a DC source, a radio frequency (RF) source, a DC-pulsed source, or a microwave source. Applying either DC, or RF power to the process gas creates an electric field in the reaction zone 118. The electric field ionizes the process gas in the reaction zone 118 to form a plasma comprising process gas ions, electrons, and process gas atoms (neutrals). Additionally, the electric field accelerates the process gas ions toward the target 110, for sputtering target particles from the target 110. When electrons in the plasma collide with the sputtered target particles, such target particles become ionized.

The PVD chamber 36 configuration enables deposition of sputtered and ionized target particles from the target 110 onto the substrate 120 to form film 122 thereon. The shield 114 confines the sputtered particles and non-reactant gas in a reaction zone within the PVD chamber 36. As such, the shield 114 prevents deposition of target particles in unwanted locations, for example, beneath the pedestal 112 or behind the target 110.

The PVD chamber 36 may comprise additional components for improving the deposition of sputtered particles onto the substrate 120. For example, the PVD chamber 36 may include a bias power source 124 for biasing the substrate 120. The bias power source 124 is coupled to the pedestal 112 for controlling material layer deposition onto the substrate 120. The bias power source 124 is typically an AC source having a frequency of, for example, about 400 kHz.

When the bias power from the power source 124 is applied to the substrate 120, electrons in the plasma accumulate toward the substrate 120, creating a negative DC offset on the substrate 120 and the pedestal 112. The bias power applied to the substrate 120 attracts sputtered target particles that become ionized. These ionized target particles are generally attracted to the substrate 120 in a direction that is substantially perpendicular thereto. As such, the bias power source 124 enhances the deposition of target particles onto the substrate 120.

The PVD chamber 36 may also comprise a magnet 126 or magnetic sub-assembly positioned behind the target 110 for creating a magnetic field proximate to the target 110. The PVD chamber 36 may also comprise a coil 130 disposed within the shield 114 between the target 110 and the substrate 120. The coil 130 may comprise either a single-turn coil or a multi-turn coil that, when energized, ionizes the sputtered particles. This process is known as Ion Metal Plasma (IMP) deposition. The coil 130 is generally coupled to an AC source 132 having a frequency of, for example, about 2 MHz.

An etchant species is provided to PVD chamber 36 from remote source 170. The etchant species is provided to the chamber 36 via one or more orifices 172 in an etch gas assembly 175. The etch species may include energized particles generated by means of a remote power source 174 that is coupled to remote source 170. The remote power source is preferably a source of RF energy. Applying RF power to the etchant gas creates an electric field that ionizes the etch species to form a plasma comprising ions, electrons, and atoms.

Figure 4:
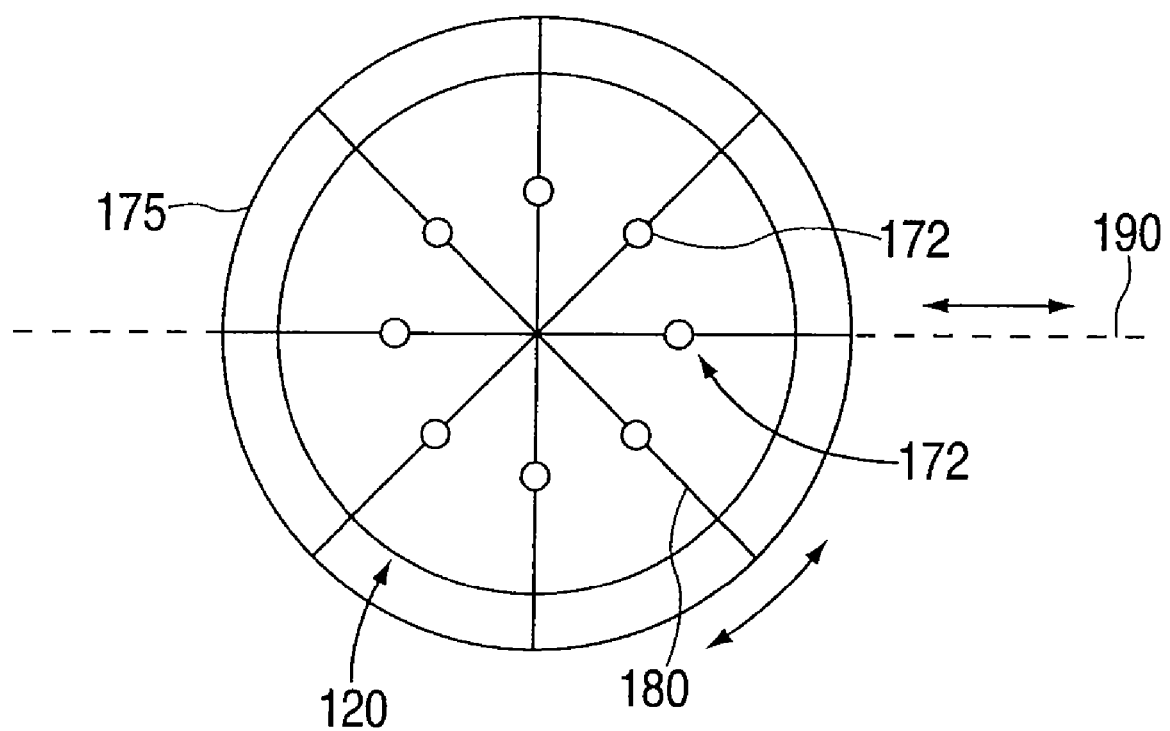
FIG. 4 depicts a top view of a gas assembly comprising a plurality of orifices.

FIG. 4 provides a top view of the substrate 120 inside the PVD chamber 36. Disposed above the substrate is the etch gas assembly 175. The etch gas assembly 175 comprises one or more orifices 172. The one or more orifices 172 provide the etch species to the PVD chamber 36.

The orifices 172 are disposed above the substrate 120 for delivering etch species to the substrate 120 in the form of a collimated gas flow. Suitable gas flow mechanisms have been described by Schmitt et al., in U.S. Pat. No. 5,725,672, entitled "Apparatus for the High Speed, Low Pressure Gas Jet Deposition of Conducting and Dielectric Thin Solid Films", issued Mar. 10, 1998; as well as by Schmitt et al. in U.S. Pat. No. 5,256,205, entitled "Microwave Plasma Assisted Supersonic Gas Jet Deposition of Thin Film Materials", issued Oct. 26, 1993, both of which are incorporated herein by reference.

The one or more orifices 172 are typically characterized as having an interior cavity and nozzle opening (not shown). The interior cavity is coupled to remote source 170. Remote source 170 provides etch species to the interior cavity of the etch gas assembly 175.

The orifices 172 are positioned above the substrate 120 so as to provide the etch species to the substrate in a collimated manner. The orifices 172 may be spaced apart from one another and along axes 180 to provide uniform delivery of the etch species to the substrate 120. While FIG. 4 depicts an etch gas assembly 175 with only eight orifices 172, it is within the teachings of the present invention for the assembly 175 to have more or less orifices 172, than are located in different positions that those depicted in FIG. 4.

The etch gas assembly 175 may optionally be movable via translational or rotational motion relative to the substrate 120. Movement of the etch gas assembly 175 within the PVD chamber 36 relative to the substrate typically promotes improved uniformity of delivery of the etch species to the substrate. The etch gas assembly may move in a linear fashion along, for example, axis 190, or in a circular fashion. The etch gas assembly 175 preferably moves in relation to the substrate at a rate of greater than about 0.1 cm/min.

Figure 5:
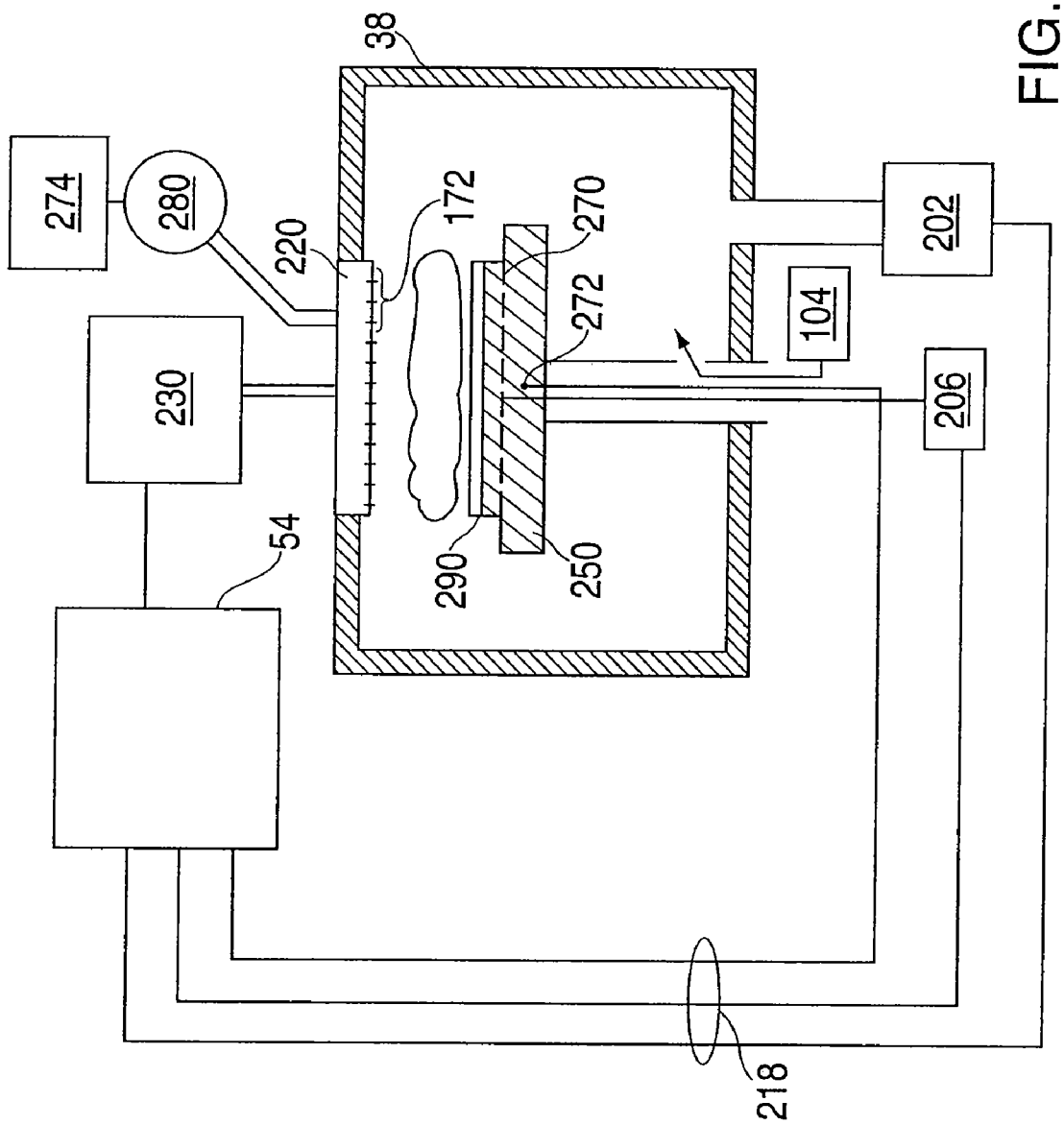
FIG. 5 depicts a schematic cross-sectional view of a chemical vapor deposition (CVD) chamber.

FIG. 5 depicts a schematic cross-sectional view of a chemical vapor deposition (CVD) process chamber 38 of wafer processing system 35. Examples of such CVD chambers 38 include TXZ™ chambers, WXZ™ chambers and PRECISION 5000® chambers, commercially available from Applied Materials, Inc., Santa Clara, Calif.

The CVD chamber 38 generally houses a wafer support pedestal 250, which is used to support a substrate 290. The wafer support pedestal 250 is movable in a vertical direction inside the CVD chamber 38 using a displacement mechanism (not shown).

Depending on the specific CVD process, the substrate 290 can be heated to some desired temperature prior to or during deposition. For example, the wafer support pedestal 250 may be heated by an embedded heater element 270. The wafer support pedestal 250 may be resistively heated by applying an electric current from an AC power supply 206 to the heater element 270. The substrate 290 is, in turn, heated by the pedestal 250.

A temperature sensor 272, such as a thermocouple, is also embedded in the wafer support pedestal 250 to monitor the temperature of the pedestal 250 in a conventional manner. The measured temperature is used in a feedback loop to control the AC power supply 206 for the heating element 270, such that the substrate temperature can be maintained or controlled at a desired temperature which is suitable for the particular process application. The wafer support pedestal 250 is optionally heated using radiant heat (not shown).

A vacuum pump 202 is used to evacuate the CVD chamber 38 and to maintain the proper gas flows and pressures inside the CVD chamber 38. A showerhead 220, through which process gases are introduced into the CVD chamber 38, is located above the wafer support pedestal 250. The showerhead may also introduce etch species in addition to process gases. The showerhead 220 is connected to a gas panel 230, that controls and supplies various process gases as well as etch species provided to the CVD chamber 38.

Proper control and regulation of the gas flows through the gas panel 230 is performed by mass flow controllers (not shown) and a microprocessor controller 54 (FIG. 2). The showerhead 220 allows process gases from the gas panel 230 to be uniformly introduced and distributed in the CVD chamber 38.

A remote chamber 280 in which an etchant is stored is connected to CVD chamber 38. The etchant comprises etch species that are supplied to CVD chamber 38 through one or more orifices 172 (FIG. 4) on showerhead 220. The etch species may be energized by means of a remote power source 274. The remote power source 274 is preferably a source of RF energy. Applying RF power to the etch species creates an electric field. The electric field ionizes the etch species to form a plasma comprising ions, electrons, and atoms (neutrals).

While FIG. 5 depicts the delivery of etch species through showerhead 220, it is within the scope of the invention that the etch species are delivered to the CVD chamber 38 through a separate gas assembly (not shown) that may, for example, be adjacent to the showerhead 220, or optionally surround the showerhead 220 (not shown).

The orifices 172 of showerhead 220 may, for example, be assembled in a configuration as illustrated in FIG. 4 and discussed above with respect to PVD chamber 36. While FIG. 4 depicts an assembly 175 with only eight orifices 172, the assembly may have more or less orifices 172 that are located in different positions than those depicted in FIG. 4. Furthermore, the showerhead may optionally be movable via translational or rotational motion relative to the substrate 120. Movement of the showerhead 220 within the CVD chamber 38 relative to the substrate typically promotes improved uniformity of delivery of the etch species to the substrate. The showerhead 220 may move in a linear fashion along, for example, axis 190 (FIG. 4), or in a circular fashion. The showerhead 220 preferably moves in relation to the substrate at a rate of greater than about 0.1 cm/min.

The CVD chamber 38 may comprise additional components for enhancing layer deposition on the substrate 290. For example, the showerhead 220 and wafer support pedestal 250 may also form a pair of spaced apart electrodes. When an electric field is generated between these electrodes, the process gases introduced into the CVD chamber 38 are ignited into a plasma.

Typically, the electric field is generated by coupling the wafer support pedestal 250 to a source of radio frequency (RF) power (not shown) through a matching network (not shown). Alternatively, the RF power source and matching network may be coupled to the showerhead 220, or coupled to both the showerhead 220 and the wafer support pedestal 250.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Referring to FIG. 2, the PVD process chamber 36 and the CVD process chamber 38 as described above are each controlled by a microprocessor controller 54. The microprocessor controller 54 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software or hardware.

Material Layer Deposition

Integrated Barrier Later Structure

In one embodiment, an integrated circuit is metallized by forming an integrated barrier layer structure in a high aspect ratio structure followed by deposition of one or more metal layers. The integrated barrier layer structure may be formed by conformably depositing one or more barrier layers comprising for example, titanium (Ti), titanium nitride (TiN), tantalum (Ta), tantalum nitride ($TaN_x$), tungsten (W), or tungsten nitride ($WN_x$), among others, on the substrate. The one or more barrier layers may be conformably deposited on the substrate using physical vapor deposition (PVD) or chemical vapor deposition (CVD).

PVD Deposition

In general, the following deposition process parameters can be used to conformably form the barrier layers using PVD. The process parameters range from a wafer temperature of about 20° C. to about 300° C., a chamber pressure of about 0.1 mtorr to about 100 torr, a DC power of about 1 kilowatt to about 20 kilowatts, and a bias power of about 1 watt to about 500 watts.

Nitrogen ($N_2$) gas is provided to the PVD deposition chamber when a nitride based barrier layer is to be formed. When $TiN_x$, $TaN_x$ or $WN_x$ are formed $N_2$ gas with a flow rate in a range of about 100 sccm to about 2000 sccm may be provided to the PVD chamber.

Also, an inert gas such as helium (He) or argon (Ar) may be provided to the PVD deposition chamber to maintain the chamber at a desired chamber pressure. The inert gas may be provided to the deposition chamber at a flow rate in a range of about 100 sccm to about 5000 sccm.

The above PVD process parameters provide a deposition rate for the one or more barrier layers in a range of about 50 Å/min to about 500 Å/min.

In conjunction with barrier layer deposition, etch species may be supplied to the PVD chamber 36. The etch species are directed toward the substrate 400 in a collimated manner in order to maintain a high concentration of etch species at the top of the high aspect ratio structure. The collimated delivery refers to movement of etch species in a direction normal to the substrate surface.

Depending on the barrier material being deposited, fluorine and/or chlorine containing gases may be used as the etch species. For example, sulfur hexafluoride ($SF_6$), carbon tetrachloride ($CCl_4$), trifluoromethane ($CHF_3$), difluoromethane ($CH_2F_2$), and fluorochloromethane ($CH_2FCl$), among others, may be used.

Collimated delivery of the etch species preferably reduces the number and/or frequency of collisions incurred by the etch species as they travel toward the substrate. The random, non-directional, kinetic energy of the gas may be converted to kinetic energy that is directed towards the substrate. As such, the etch species are more likely to reach the top of the high aspect ratio structures at their most active chemical state, thereby enhancing etching in such areas.

In order to provide sufficient collimation for the etch species, the pressure in the remote source 170 is greater than the pressure in the PVD chamber. Under such conditions, the flow of etch species through orifices 172 is directed toward the substrate 120. The gas pressure in the remote source 170 may, for example, be in the range of about 1 to 10 torr and the pressure in the PVD chamber may, for example, be in the range of about 1 militorr to about 1 torr.

CVD Deposition

Using CVD techniques, the one or more barrier layers may be formed by thermally decomposing, for example, a tungsten precursor, a titanium-containing precursor, or a tantalum-containing precursor. The tungsten precursor may be selected from tungsten hexafluoride ($WF_6$) and tungsten carbonyl ($W(CO)_6$). The tantalum-containing precursor may be selected, for example, from the group of tantalum pentachloride ($TaCl_5$), pentakis(diethylamido) tantalum (PDEAT) (Ta($Net_2$)$_5$), pentakis (ethylmethylamido) tantalum (PEMAT) (Ta(N(Et)(Me))$_5$), and pentakis(dimethylamido) tantalum (PDMAT) (Ta($Nme_2$)$_5$), among others. The titanium-containing precursor may be selected, for example, from the group of titanium tetrachloride ($TiCl_4$), tetrakis(diethylamido) titanium (TDEAT) (Ti($Net_2$)$_4$), tetrakis (ethylmethylamido) titanium (TEMAT) (Ti(N(Et)(Me))$_4$), and tetrakis(dimethylamido) titanium (TDMAT) (Ti($NMe_2$)$_4$), among others.

Carrier gases such as hydrogen ($H_2$), helium (He), argon (Ar), and nitrogen ($N_2$), among others may be mixed with the tantalum, titanium, or tungsten precursors.

In general, the following process parameters can be used to form the one or more barrier layers using CVD techniques in a process chamber similar to that shown in FIG. 5. The process parameters range from a wafer temperature of less than about 450° C., a chamber pressure of about 0.1 mtorr to about 10 torr, a tantalum, titanium, or tungsten precursor flow rate of about 50 sccm to about 7000 sccm, and a carrier gas flow rate of about 100 sccm to about 1 slm. The above process parameters typically provide a deposition rate for the CVD deposited one or more barrier layers in a range of about 10 Å/min. to about 2000 ÅA/min.

Depending on the barrier material being deposited, fluorine and/or chlorine containing gases may be used as the etch species. For example, sulfur hexafluoride ($SF_6$), carbon tetrachloride ($CCl_4$), trifluoromethane ($CHF_3$), difluoromethane ($CH_2F_2$), and fluorochloromethane ($CH_2FCl$), among others.

Collimated delivery of the etch species preferably reduces the number and/or frequency of collisions incurred by the etch species as they travel toward the substrate. The random, non-directional, kinetic energy of the gas may be converted to kinetic energy that is directed towards the substrate. As such, the etch species are more likely to reach the top of the high aspect ratio structures at their most active chemical state, thereby enhancing etching in such areas.

In order to provide sufficient collimation for the etch species, the pressure in the source 280 is greater than the pressure in the CVD chamber. Under such conditions, the flow of etch species through orifices 172 is directed toward the substrate 120. The gas pressure in the remote source 280 may, for example, be in the range of about 1 to 10 torr and the pressure in the CVD chamber may, for example, be in the range of about 1 militorr to about 1 torr.

The above process parameters are suitable for implementation on a 200 mm (millimeter) substrate in a deposition chamber available from Applied Materials, Inc., Santa Clara, Calif. Other deposition chambers are within the scope of the invention, and the parameters listed above may vary according to the particular deposition chambers used to form the one or more barrier layer. For example, other deposition chambers may have a larger (e.g., chambers configured to accommodate 300 mm substrates) or a smaller volume, requiring gas flow rates, or powers that are larger or smaller than those recited for deposition chambers available from Applied Materials, Inc.

Subsequent to the barrier layer formation, one or more metal layers are conformably deposited on the integrated barrier layer structure. The one or more metal layers are conformably deposited using chemical vapor deposition (CVD), physical vapor deposition (PVD), and/or combinations thereof. For example, a CVD copper layer may be deposited from a gas mixture containing $Cu^{+2}(hfac)_2$ (copper hexafluoro acetylacetonate), $Cu^{+2}(fod)_2$ (copper heptafluoro dimethyl octanediene), $Cu^{+1}hfac$ TMVS (copper hexafluoro acetylacetonate trimethylvinylsilane), or combinations thereof.

Depending on the metal layer being deposited, fluorine and/or chlorine containing gases may be used as the etch species. For example, sulfur hexafluoride ($SF_6$), carbon tetrachloride ($CCl_4$), trifluoromethane ($CHF_3$), difluoromethane ($CH_2F_2$), and fluorochloromethane ($CH_2FCl$), among others.

Collimated delivery of the etch species preferably reduces the number and/or frequency of collisions incurred by the etch species as they travel toward the substrate. The random, non-directional, kinetic energy of the gas may be converted to kinetic energy that is directed towards the substrate. As such, the etch species are more likely to reach the top of the high aspect ratio structures at their most active chemical state, thereby enhancing etching in such areas.

In order to provide sufficient collimation for the etch species, the pressure in the source 170 is greater than the pressure in the PVD or CVD chamber. Under such conditions, the flow of etch species through orifices 172 is directed toward the substrate 120. The gas pressure in the remote source 170, 280 may, for example, be in the range of about 1 to 10 torr and the pressure in the PVD or CVD chamber may, for example, be in the range of about 1 militorr to about 1 torr.

FIGS. 6A-6D are schematic cross-sectional views of a substrate undergoing various stages of integrated barrier layer deposition. Depending upon the specific stage of processing, the substrate may correspond to a silicon wafer or other material layer that has been formed thereon.

Figure 6A:
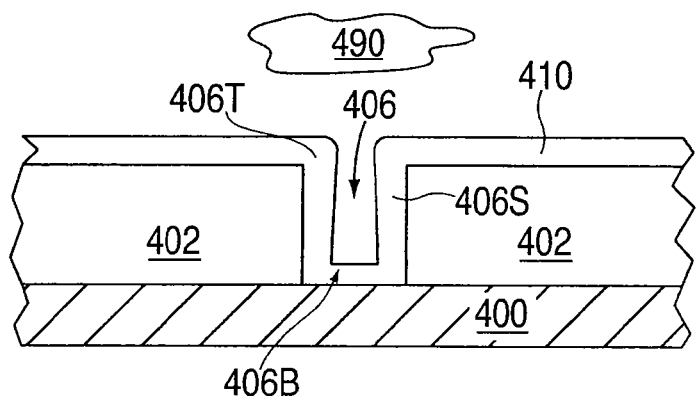
FIGS. 6A-6D depict schematic cross-sectional views of a substrate at different stages of integrated circuit fabrication.

FIG. 6A illustrates a cross-sectional view of a substrate 400 having a layer 402 formed on a substrate 400. The layer 402 has at least one opening 406 therein exposing portions of the substrate 400 surface. The opening 406 may generally denote an interconnect feature such as a via. The interconnect feature has an aspect ratio (ratio of the feature depth to the feature width) of greater than about 4:1.

Figure 7:
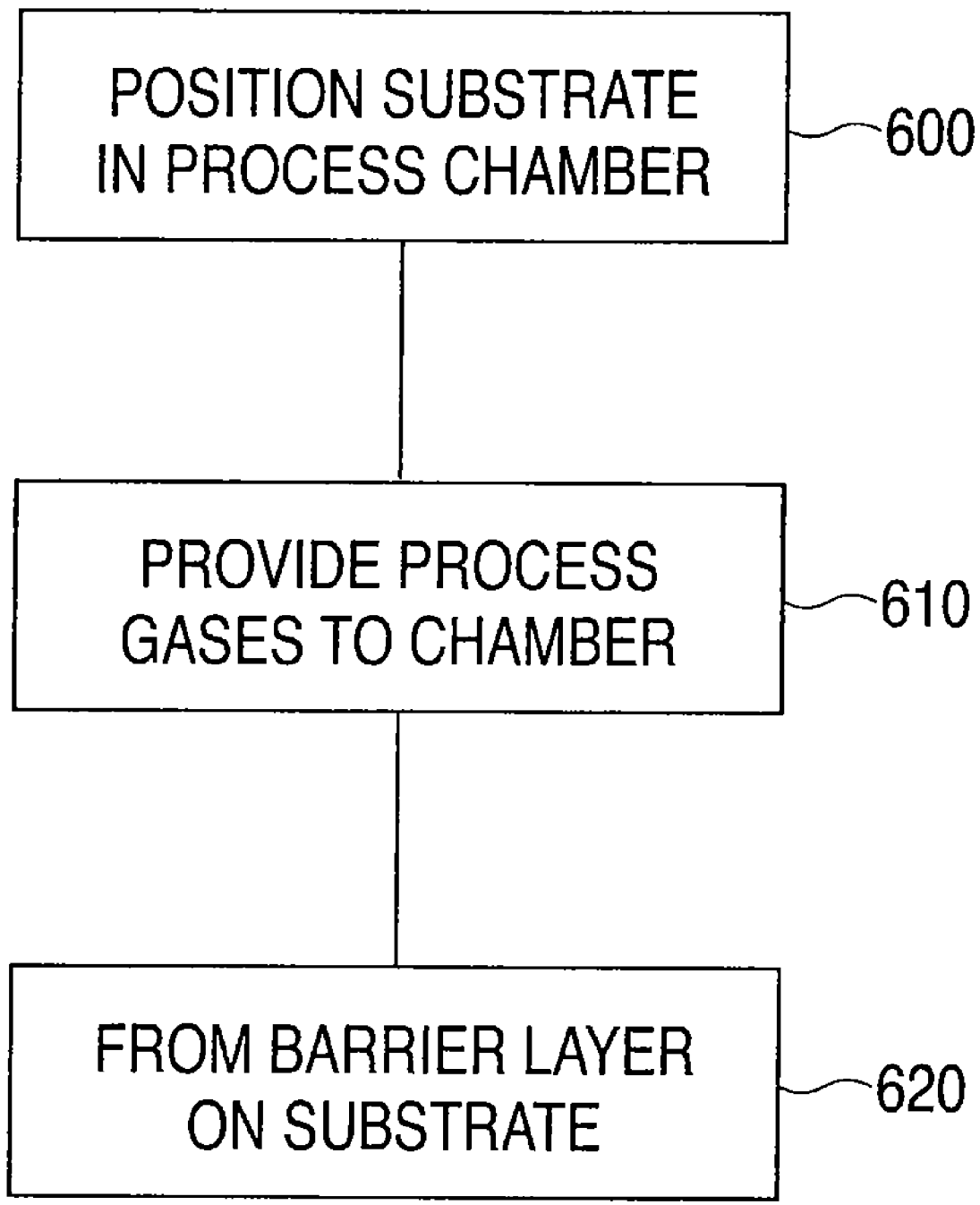
FIG. 7 depict a series of process steps for depositing a material layer using the method described herein.

FIG. 7 depicts a process flow diagram in which a typical process sequence is executed for depositing the integrated barrier layer structure in opening 406. In step 600, the substrate 400 is positioned in a process chamber. The process chamber may be, for example, a chemical vapor deposition chamber 38 or a physical vapor deposition chamber 36 housed in a cluster tool 35, such as shown in FIGS. 2-3 and 5.

As indicated in FIG. 6A and in steps 610-620 of FIG. 7, one or more process gases 490 are supplied to the chamber. For a PVD chamber, the one or more process gases 490 may comprise one or more inert gases that are used to sputter material from a PVD sputter target on the substrate 400 in the at least one opening 406. The inert gases may be, for example, Argon (Ar), Helium (He).

For a CVD chamber, the one or more process gases 490 may include one or more gases that are reacted to form a barrier layer 410 on the substrate 400. The one or more process gases 490 may comprise for example titanium tetrachloride ($TiCl_4$) and ammonia ($NH_3$). The process gases 490 are used to deposit the barrier layer 410 inside opening 406 on the substrate 400. The process gases also include etch species. The etch species may include energized particles.

Figure 6B:
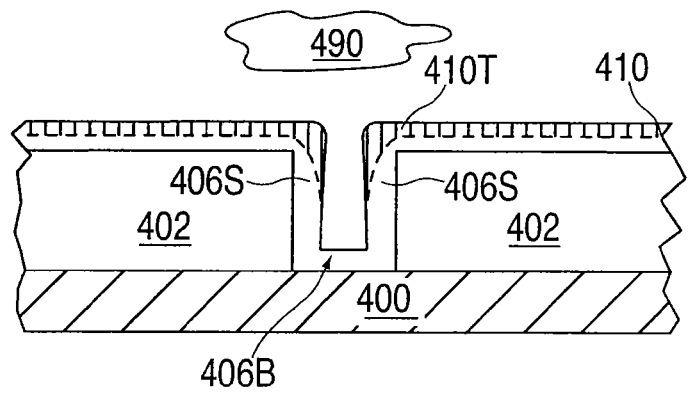

Referring to FIG. 6B, the etch species in the process gas 490 removes material deposited around the top 406T of the opening at a greater rate than for material deposited at the bottom 406B or sides 406S of the opening. This allows deposition to proceed at the bottom 406B or the sides 406S of the opening 406 without the top 406T opening 406 being prematurely closed off by excessive deposition.

Figure 6C:
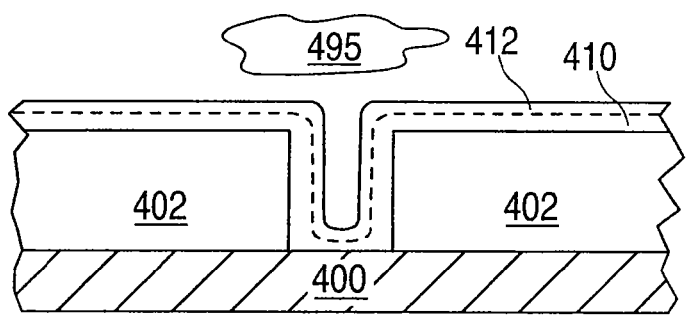
Figure 6D:
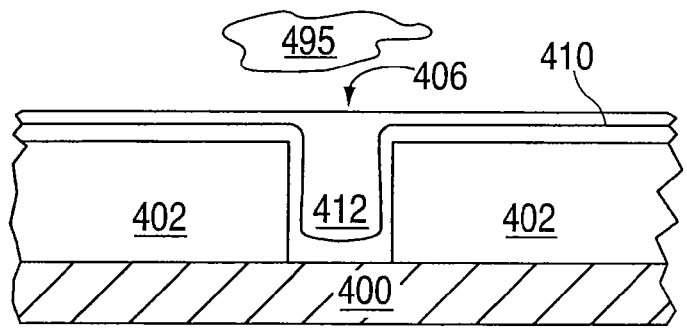

As shown in FIG. 6C, after the barrier layer 410 is formed, the opening 406 is filled with a metal 412. The metal layer 412 is deposited from process gases 495. The metal layer 412 is deposited over the barrier layer 410 previously formed within opening 406. Depending on the metal layer to be deposited, the composition of the process gases 490 may have a similar composition to the process gases 495. Again the etch species in the process gases 495 preferentially removes excess metal 412 deposited around the top 406T of the opening 406, such that the opening 406 is filled in a "bottom-up" manner, as shown in FIG. 6D.

Trench Insulator Structure

Figure 8A:
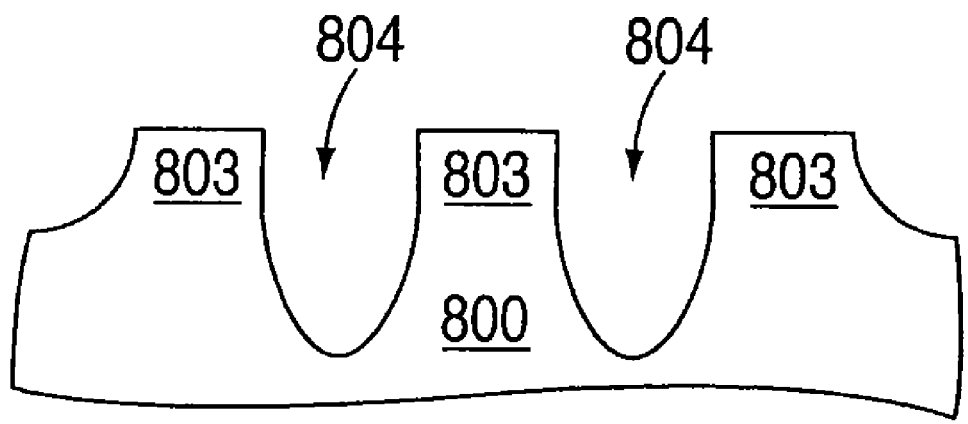
FIGS. 8A-8B depict schematic cross-sectional views of a substrate at different stages of integrated circuit fabrication.
Figure 8B:
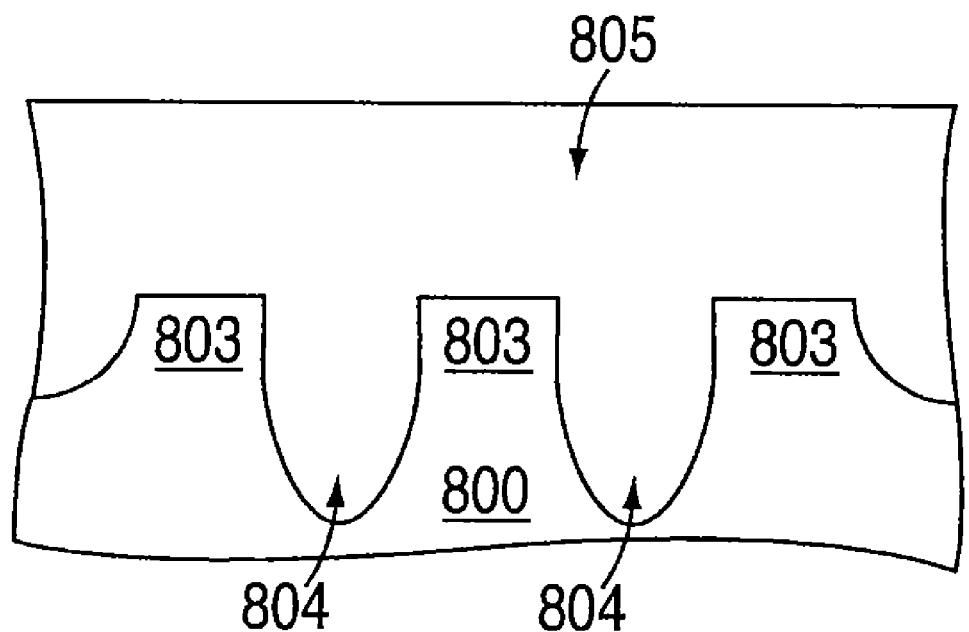

FIGS. 8A-8B illustrate schematic cross-sectional views of a substrate 800 at different stages of an integrated circuit fabrication sequence incorporating a oxide layer as a trench isolation material. In general, the substrate 800 refers to any workpiece on which processing is performed, and a substrate structure 850 is used to generally denote the substrate together with other material layers formed on the substrate 800. Depending on the specific stage of processing, the substrate 800 may correspond to a silicon substrate, or other material layer that has been formed on the substrate.

FIG. 8A, for example, illustrates a cross-sectional view of a trench structure 850. The trench structure includes active semiconductor regions 803 and trench regions 804. The trench regions 804 may have depth of about 5-10 microns.

FIG. 8B depicts an oxide layer 805 formed on the trench structure 850 of FIG. 8A. The oxide layer 805 fills the trench regions 804 of the trench structure 850.

The oxide layer 804 may be a silicate, such as a low dielectric constant organosilicate layer formed by reacting a gas mixture comprising a silane compound, an oxygen source, and an inert gas. The silane compound may have the general formula $Si(CH_3)_a H_{4-a}$ where a has a range between 1 and 4. For example, methylsilane ($SiCH_6$), dimethylsilane ($SiC_2H_8$), trimethylsilane ($SiC_3H_{10}$) and tetramethylsilane ($SiC_4H_{12}$) may be used as the organosilane compound.

Oxygen ($O_2$), ozone ($O_3$), nitrous oxide ($N_2O$), carbon monoxide (CO), carbon dioxide ($CO_2$), or combinations thereof, among others, may be used as the oxygen source. Helium (He), argon (Ar), and combinations thereof, among others, may be used as the inert gas.

In general, the following deposition process parameters may be used to form the silicate layer using a CVD process chamber similar to that shown in FIG. 5. The process parameters range from a wafer temperature of about 50° C. to about 250° C., a chamber pressure of about 1 torr to about 500 torr, a silane compound gas flow rate of about 50 sccm to about 1000 sccm, an oxygen source gas flow rate of about 10 sccm to about 1000 sccm, and an inert gas flow rate of about 1000 sccm to about 10,000 sccm. The above process parameters provide a deposition rate for the organosilicate layer in a range of about 0.1 micron/minute to about 2 microns/minute when implemented on a 200 mm (millimeter) substrate in a deposition chamber available from Applied Materials, Inc.

Depending on the composition of the oxide material deposited, fluorine and/or chlorine containing gases may be used as the etch species. For example, sulfur hexafluoride ($SF_6$), trifluoromethane ($CHF_3$), difluoromethane ($CH_2F_2$), and fluorochloromethane ($CH_2FCl$), among others may be used.

Collimated delivery of the etch species preferably reduces the number and/or frequency of collisions incurred by the etch species as they travel toward the substrate. The random, non-directional, kinetic energy of the gas may be converted to kinetic energy that is directed towards the substrate. As such, the etch species are more likely to reach the top of the high aspect ratio structures at their most active chemical state, thereby enhancing etching in such areas.

In order to provide sufficient collimation for the etch species, the pressure in the remote source 280 (FIG. 5) is greater than the pressure in the CVD chamber. Under such conditions, the flow of etch species through orifices 172 is directed toward the substrate 290. The gas pressure in the remote source 280 may, for example, be in the range of about 1 to 10 torr and the pressure in the CVD chamber may, for example, be in the range of about 1 militorr to about 1 torr.

Referring to FIG. 8B, the etch species in the process gases remove material 805 deposited around the top 804 of the opening at a greater rate than for material deposited at the bottom or sides of the opening. This allows deposition to proceed at the bottom or the sides of the trench 804 without the top region being prematurely closed off by excessive deposition.

Although several preferred embodiments which incorporate the teachings of the present invention have been shown and described in detail, those skilled in the art can readily devise many other varied embodiments that still incorporate these teachings.

What is claimed is:

1. A method of forming a trench structure, comprising:
  positioning a substrate having high aspect ratio features in a deposition chamber;
  ionizing one or more chemical etch species selected from the group comprising sulfur hexafluoride ($SF_6$), carbon tetrachloride ($CCl_4$), trifluoromethane ($CHF_3$), difluoromethane ($CH_2F_2$), and fluorochloromethane ($CH_2FCl$) in a remote chamber by a remote power source;
  providing a gas mixture to the deposition chamber, wherein the gas mixture comprises one or more process gases and the one or more ionized chemical etch species, wherein the one or more ionized chemical etch species are provided into the deposition chamber in a collimated manner; and
  depositing an oxide layer on the substrate from the one or more process gases, wherein the ionized chemical etch species in the gas mixture selectively remove portions of a material layer deposited adjacent to the high aspect ratio features.

2. The method of claim 1, wherein the ratio of the height to the width of the high aspect ratio features is greater than about 4:1.

3. The method of claim 1, wherein the one or more ionized chemical etch species are provided to the deposition chamber through one or more orifices capable of directing such ionized chemical etch species in a collimated manner toward the substrate.

4. The method of claim 3, wherein a pressure gradient exists across the orifices comprising a first pressure upstream from the orifices and a second pressure downstream from the orifices.

5. The method of claim 4, wherein a first pressure is greater than the second pressure.

6. The method of claim 1, wherein the deposition chamber is a chemical vapor deposition (CVD) chamber.

* * * * *